United States Patent
Shimoyama et al.

(10) Patent No.: US 6,278,137 B1
(45) Date of Patent: *Aug. 21, 2001

(54) SEMICONDUCTOR LIGHT-EMITTING DEVICES

(75) Inventors: Kenji Shimoyama; Nobuyuki Hosoi; Katsushi Fujii; Atsunori Yamauchi; Hideki Gotoh; Yoshihito Sato, all of Ushiku (JP)

(73) Assignee: Mitsubishi Chemical Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/035,333

(22) Filed: Mar. 5, 1998

Related U.S. Application Data

(62) Division of application No. 08/521,980, filed on Aug. 31, 1995, now Pat. No. 5,811,839.

(30) Foreign Application Priority Data

Sep. 1, 1994 (JP) .................................................. 6-208671
Sep. 1, 1994 (JP) .................................................. 6-208672
Oct. 24, 1994 (JP) .................................................. 6-258280

(51) Int. Cl.$^7$ .................................................. H01L 33/00
(52) U.S. Cl. .............................. 257/102; 257/96; 257/97; 372/45; 372/46
(58) Field of Search ..................... 257/97, 96, 94, 257/102; 372/45, 46

(56) References Cited

U.S. PATENT DOCUMENTS

| 4,740,977 | 4/1988 | Ikeda ...................................... 372/45 |
| 4,764,934 | * 8/1988 | Kwong et al. .......................... 372/46 |

(List continued on next page.)

FOREIGN PATENT DOCUMENTS

| 0 408 373 A2 | 1/1991 | (EP) . |
| 540 799 A1 | * 5/1991 | (EP) ...................................... 372/46 |

(List continued on next page.)

OTHER PUBLICATIONS

P. Unger et al.; "Junction–Side Of (Al)GaInP Lasers With Very Low Threshold Currents", Electronics Letters 1992, vol. 28, No. 16, pp. 1531–1532.

(List continued on next page.)

*Primary Examiner*—Eddie Lee
*Assistant Examiner*—Bradley Wm. Baumeister
(74) *Attorney, Agent, or Firm*—Armstrong, Westerman, Hattori, McLeland & Naughton, LLP

(57) ABSTRACT

The present invention provides a semiconductor light-emitting device including a first clad layer comprising a first conductive type of AlGaAsP compound, a second clad layer that is located next to the first clad layer, comprises a first conductive type of AlGaInP compound and has a thickness of up to 0.5 $\mu$m, an active layer that is located next to the second clad layer and comprises a first or second conductive type AlGaInP or GaInP, a third clad layer that is located next to the active layer, comprises a second conductive type of AlGaInP compound and has a thickness of up to 0.5 $\mu$m, and a fourth clad layer that is located next to the third clad layer and comprises a second conductive type of AlGaAsP compound, and/or a light-extracting layer that comprises a second conductive type AlGaP or GaP and has a thickness of 1 $\mu$m to 100 $\mu$m.

8 Claims, 4 Drawing Sheets

U.S. PATENT DOCUMENTS

| | | | |
|---|---|---|---|
| 5,008,718 | 4/1991 | Fletcher et al. | 357/17 |
| 5,048,035 * | 9/1991 | Sugawara et al. | 372/45 |
| 5,065,404 * | 11/1991 | Okajima et al. | 372/46 |
| 5,202,895 | 4/1993 | Nitta et al. | 372/45 |
| 5,216,263 | 6/1993 | Paoli | 257/88 |
| 5,233,204 | 8/1993 | Fletcher et al. | 257/13 |
| 5,282,218 | 1/1994 | Okajima et al. | 372/46 |
| 5,305,341 | 4/1994 | Nishikawa et al. | 372/45 |
| 5,317,586 | 5/1994 | Thornton et al. | 372/45 |
| 5,416,790 | 5/1995 | Yodoshi et al. | 372/46 |
| 5,481,122 | 1/1996 | Jou et al. | 257/9 |
| 5,506,423 | 4/1996 | Saeki | 257/97 |
| 5,565,694 | 10/1996 | Huang et al. | 257/97 |
| 5,619,518 * | 4/1997 | Horie et al. | 372/46 |
| 5,811,839 * | 9/1998 | Shimoyama et al. | 257/94 |

FOREIGN PATENT DOCUMENTS

| | | | |
|---|---|---|---|
| 540 799 A1 * | 5/1993 | (EP) | H01L/33/00 |
| 0 540 799 A1 | 5/1993 | (EP) . | |
| 61-91991 | 5/1986 | (JP) . | |
| 63-233587 | 9/1988 | (JP) . | |
| 03112186 * | 5/1991 | (JP) | 372/46 |
| 4-212497 | 8/1992 | (JP) . | |

OTHER PUBLICATIONS

D.P. Bour et al.; "610–nm Band AlGaInP Single Quantum Well Laser Diode", vol. 6, No. 2, (Feb. 1994), pp. 128–131.

J.A. Skidmore et al.; "High–Power CW Operation of AlGaInP Laser–Diode Array at 640 nm", vol. 7, No. 2 (Feb. 1995), pp. 133–135.

M.L. Xu et al.; "Ultra–High Differential Gain in GaInAs–AlGaInAs Quantum Wells: Experiment and Modeling", vol. 7, No. 9, (Sep. 1995), pp. 947–951.

Patent Abstracts of Japan; vol. 014, No. 032 (E–876), Jan. 22, 1990 & JP 01 268179 A (Toshiba Corp). Oct. 25, 1989, abstract.

Patent Abstracts of Japan; vol. 016, No. 236 (E–1210), May 29, 1992 & JP 04–048669 A, (Fujitsu Ltd), Feb. 18, 1992, abstract.

Patent Abstracts of Japan; vol. 011, No. 143 (E–504), May 9, 1987 & JP 61–280694 A, (NEC Corp), Dec. 11, 1986, abstract.

Patent Abstracts of Japan; vol. 015, No. 311 (E–1098), Aug. 8, 1991 & JP 03–112186 A, (NEC Corp), May 13, 1991, abstract.

Journal of Crystal Growth—vol. 138, No. 1/4, Apr. 2, 1994, pp. 768–775, XP000474550 Kazuhiko Itaya et al.: "InGaAlP Visible Light Laser Diodes and Light–Emitting Diodes".

* cited by examiner

SEMICONDUCTOR LIGHT-EMITTING DEVICES

This is a division of application Ser. No. 08/521,980, filed Aug. 31, 1995, now U.S. Pat. No. 5,811,839.

BACKGROUND OF THE INVENTION

The present invention relates to semiconductor light-emitting devices such as semiconductor light-emitting diodes and semiconductor laser diodes, which are obtained using AlGaInP and AlGaAsP semiconductor materials.

One exemplary prior art semiconductor light-emitting diode (LED for short) using an AlGaInP semiconductor material is schematically illustrated in FIG. 1.

Referring now to FIG. 1, reference numeral 201 represents an n-type GaAs substrate, and 202 a clad layer comprising an n-type AlGaInP, which is formed on the substrate 201. Reference numeral 203 represents an active layer comprising AlGaInP, and 204 a clad layer comprising a p-type AlGaInP. That is, the Al concentration is preset so that the energy gap of the AlGaInP active layer 203 is narrower than those of the AlGaInP clad layers 202 and 204. A p-type AlGaAs current-spreading layer 205 is provided to expand the electric current injected from electrodes, thereby expanding the light-emitting region and so increasing the efficiency of light extraction. Reference numeral 206 stands for a contact layer, and 207 and 208 Indicate electrodes.

One exemplary prior art semiconductor laser diode (LD for short) in schematically shown in FIG. 2.

Referring here to FIG. 2, reference numeral 201 stands for an n-type GaAs substrate, and 202 a clad layer comprising an n-type AlGaInP, which is formed on the substrate 201. Reference numeral 203 represents an active layer comprising AlGaInP, and 204 a clad layer comprising a p-type AlGaInP. That is, the Al concentration is preset so that the energy gap of the AlGaInP active layer 203 is narrower than those of the AlGaInP clad layers 202 and 204; in other words, the double-hetero structure is achieved. Reference numeral 206 indicates a contact layer.

Reference numeral 205' represents a current block layer comprising GaAs, which is provided for the purpose of achieving the so-called current confinement, thereby obtaining the current density needed for laser oscillation. This layer 205' is formed by selectively etching the layer 204 to form a ridge thereon, followed by selective growth using an amorphous film such as one of $SiN_x$.

AlGaInP or AlInP (which may hereinafter be collectively called an AlGaInP compound) have some defects; they are higher in resistivity and thermal resistance than AlGaAsP or AlGaAs (which may hereinafter be collectively called an AlGaAsP compound). Such detects lead to a problem that the operating voltage of the device becomes too high, resulting in an increase in the amount of the heat generated. This problem must be solved so as to improve the characteristics and reliability of the device, and becomes serious especially when the eight-omitting density becomes high.

The above-mentioned problem becomes by far more serious the case of a semiconductor laser where current confinement is required with an increase in the light-emitting density.

Zinc (Zn) is generally used as a dopant for a clad layer comprising a p-type AlGaInP compound, but doping should be done at high concentration so as to lower resistivity, because Zn is low in the rate of activation. In this case, however, unactivated Zn diffuses so rapidly through the AlGaInP compound crystal body that the pn junction position is often largely shifted from the light-emitting layer toward the n-type layer. This, in turn, gives rise to abnormality in the current-voltage characteristics, a drop of light output power, and an increase in the threshold current of laser. Such diffusion of Zn from the p-type AlGaInP compound layer becomes noticeable as its thickness increases. When the light-emitting layer is relatively thin as in the case of laser, the current-voltage characteristics are liable to disorder due to the diffusion of Zn. Silicon (si) having a low diffusion coefficient is effective for an n-type AlGaInP compound.

In some cases, a light-extracting layer is located next to the clad layer. The transparency of the light-extracting layer to the light-emitting wavelength is important for improving the light-extraction efficiency of LED. However, it is probable that some light-extracting layer with high transparency has high resistivity depending on composition and that the surface current spreading area in small, as a result.

With respect to the double-hetero structure, it is usually required to impart a thickness of about 1 $\mu$m to about 2 $\mu$m to the clad layer to ensure confinement of carriers and light in the active layer. When the AlGaInP compound is grown by a metal organic vapor phase growth technique, it is required that the feed molar ratio (V/III) between the organic metal that is the group III material and $PH_3$ that is the group V material be very high. This incurs some inconveniences; for instance, no high growth rate can be applied, the cost of the material to be grown is much higher than the AlGaAs compound, and so on. Especially in the case of mass-production equipment of large size enabling a multiplicity of devices to be produced at the same time, problems with removal of defects become more serious.

SUMMARY OF THE INVENTION

An object of the present invention is to optimize the structure of clad layers of a semiconductor light-emitting device including an active layer comprising AlGaInP or GaInP.

Another object of the present invention is to reduce the thickness of a Zn-doped clad layer comprising a p-type AlGaInP compound.

A further object of the present invention is to substantially eliminate or reduce the diffusion of zn into an active layer and an n-type clad layer.

A still further object of the present invention is to prevent a shift of the pn junction position due to the diffusion of Zn.

A still further object of the present invention is to improve the characteristics and reliability of a light-emitting device.

A still further object of the present invention is to expedite mass production, reduce growth time, cut down material cost, and remove defects.

According to the present invention, it has now been found that in a semiconductor light-emitting device including an active layer comprising AlGaInP or GaInP, the diffusion of Zn into the active layer or an n-type clad layer can be reduced, if the thickness of a Zn-doped clad layer comprising a p-type AlGaInP compound is reduced to such an extent that the characteristics of the light-emitting device does not degrade. However, when the thicknesses of the AlGaInP compound clad layers with the active layers being interleaved between them are reduced, the confinement of carriers and light becomes insufficient, resulting in degradation of the device characteristics. According to the present invention, it has been found that this can be made up for by use of an AlGaAsP compound having a substantially identical band gap and refractive index. Furthermore, it has been found that since the n-type AlGaAsP compound is less susceptible to Zn diffusion than the AlGaInP compound having a substantially equal carrier concentration, the reduction in the thickness of the n-type AlGaInP compound clad layer is also effective for preventing a shift of the pn junction position due to Zn diffusion; the reduction in the thickness of the AlGaInP compound clad layer is further effective for reducing operating voltage and thermal resistance; it is advantageous in view of mass productivity, growth time, material cost, and defect removal that the thickness of the AlGaInP compound layer is reduced as much as possible and the amount of the AlGaAsP compound used is increased, correspondingly.

More specifically, the present invention provides a semiconductor light-emitting device characterized by including a first clad layer comprising a first conductive type AlGaAsP or AlGaAs, a second clad layer that is located next to the first clad layer, comprises a first conductive type AlGaInP or AlInP and has a thickness of up to 0.5 $\mu$m, an active layer that is located next to the second clad layer and comprises a first or second conductive type AlGaInP or GaInP, a third clad layer that is located next to the active layer, comprises a second conductive type AlGaInP or AlInP and has a thickness of up to 0.5 $\mu$m, and a fourth clad layer that is located next to the third clad layer and comprises a second conductive type AlGaAsP or AlGaAs, or a light-extracting layer that comprises a second conductive type AlGaP or GaP and has a thickness of 1 $\mu$m to 100 $\mu$m.

DESCRIPTION OF THE PREFERRED EMBODIMENT

The present invention will now be explained at great length.

The present invention provides a semiconductor light-emitting device characterized by including a first clad layer comprising a first conductive type of AlGaAsP compound, a second clad layer that is located next to the first clad layer, comprises a first conductive type of AlGaInP compound and has a thickness of up to 0.5 $\mu$m, an active layer that is located next to the second clad layer and comprises a first or second conductive type AlGaInP or GaInP, a third clad layer that is located next to the active layer, comprises a second conductive type of AlGaInP compound and has a thickness of up to 0.5 $\mu$m, and a fourth clad layer that is located next to the third clad layer and comprises a second conductive type of AlGaAsP compound, and/or a light-extracting layer that comprises a second conductive type AlGaP or GaP. It is here to be noted that whether the semiconductor light-emitting device of the present invention is used in the form of a laser diode or an LED, the contents of the constitutional elements of the layers thereof may be determined while lattice matching between the substrate and each layer is taken into consideration.

Figure 1:
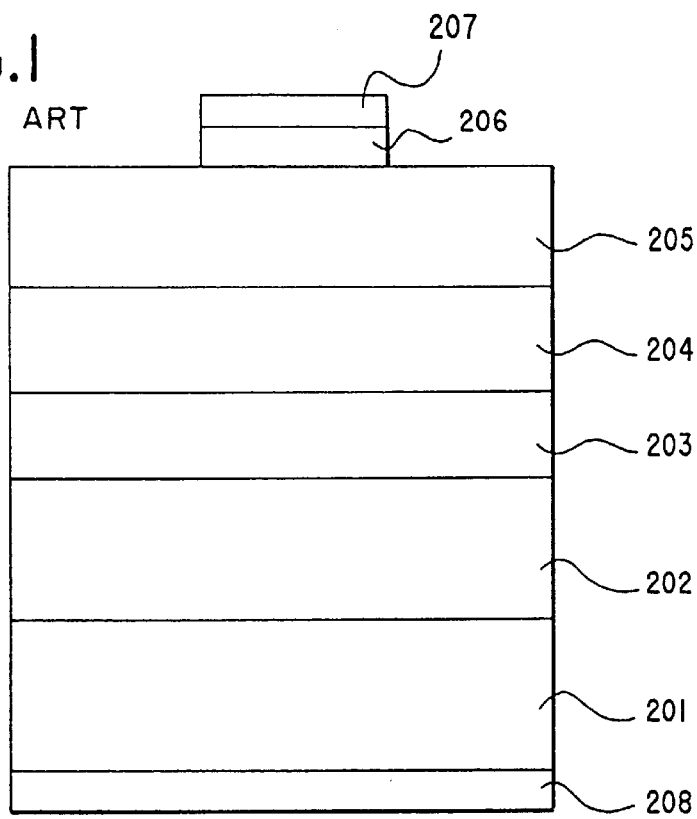
FIG. 1 is a schematic view of one exemplary prior art light-emitting diode.
Figure 2:
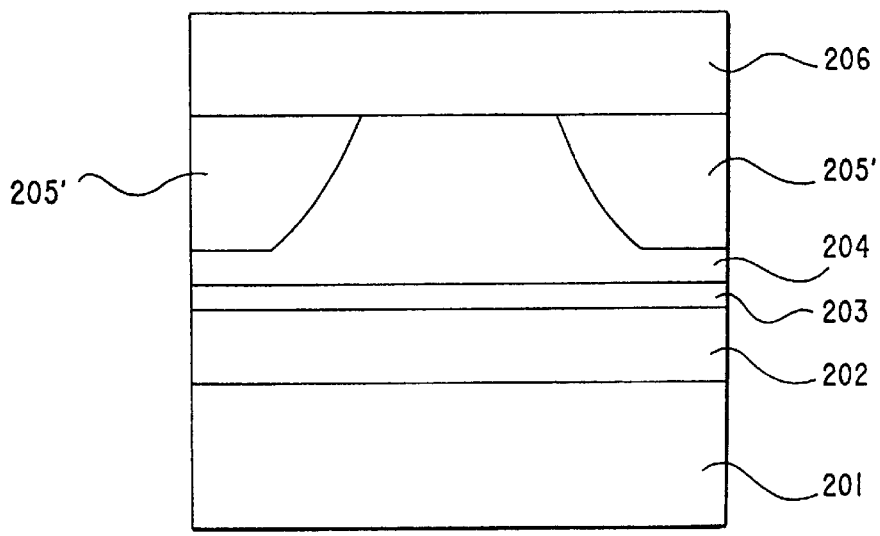
FIG. 2 is a schematic view of one examplary prior art laser diode.
Figure 3:
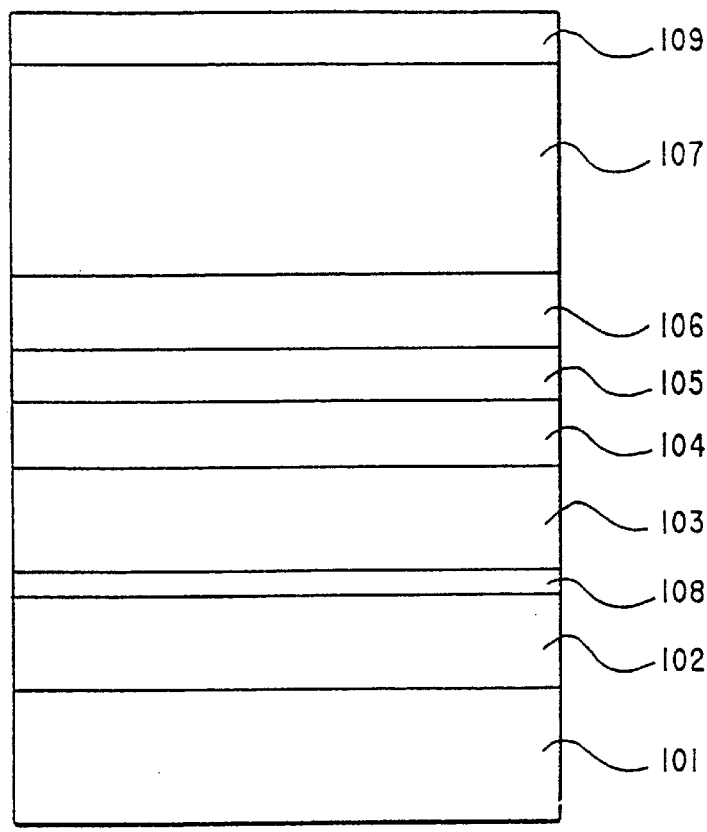
FIG. 3 is a schematic view of one embodiment of the semiconductor light-omitting device according to the present invention, that is, a semiconductor light-emitting diode including a fourth clad layer that is located next to the third clad layer and comprises a second conductive type of AlGaAsP compound.
Figure 4:
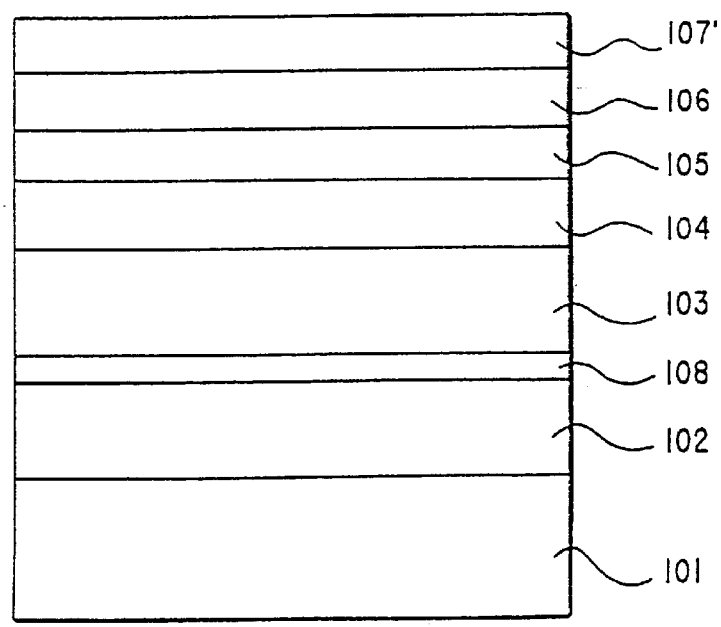
FIG. 4 is a schematic view of another embodiment of the semiconductor light-emitting device according to the present invention, that is, a semiconductor light-emitting diode including a light-extracting layer that is located next to the third clad layer and comprises a second conductive type AlGaP or GaP.

Referring first to FIGS. 3 and 4, two embodiments of the light-emitting device of the present invention achieved in the form of light-emitting diodes (LEDs) are explained.

Shown in FIG. 3 is one embodiment of the present invention, i.e., one example of the semiconductor light-emitting device including a fourth clad layer next to a third clad layer, said fourth clad layer comprising a second conductive type of AlGaAsP compound. This device is produced according to Example 1, given later. For production, the device of the present invention is usually formed on a single crystal substrate. For this substrate 101, a GaAs substrate is usually but no exclusively used. To decrease the aluminum composition of the active layer depending on light-emitting wavelength, etc., it is preferable to use a GaAsP substrate. It is preferable that a buffer layer 102 of up to about 2 $\mu$m is usually formed on the substrate, thereby preventing transfer of substrate defects into epitaxially grown layers. Then, a first clad layer 103, a second clad layer 104, the active layer 105, the third clad layer 106 and the fourth clad layer 107 are stacked on the buffer layer in the described order according to the present invention.

The first clad layer 103 is formed of a first conductive type of AlGaAs compound, and it is preferable that its thickness is usually up to 15 $\mu$m. More preferably, the lower and upper limits of the thickness of the first clad layer are 0.1 $\mu$m and 2 $\mu$m, respectively. The first clad layer should preferably have a carrier concentration lying in the range of $5\times10^{16}$ cm$^{-3}$ to $3\times10^{18}$ cm$^{-3}$, particularly with the lower and upper limits being $1\times10^{17}$ cm$^{-3}$ and $\times10^{18}$ cm$^{-3}$, respectively.

Stacked on the first clad layer is the second clad layer 104 comprising a first conductive type of AlGaInP compound and having a thickness of up to 0.5 $\mu$m. More preferably, the lower and upper limits of the thickness of this layer are 0.01 $\mu$m and 0.3 $\mu$m, respectively. The second clad layer should preferably have a carrier concentration lying in the range of $5\times10^{16}$ cm$^{-3}$ to $3\times10^{18}$ cm$^{-3}$, particularly with the lower and upper limits being $1\times10^{17}$ cm$^{-3}$ and $1\times10^{18}$ cm$^{-3}$, respectively.

Stacked on the second clad layer is the active layer 105 comprising a first or second conductive type AlGaInP or GaInP. The active layer should preferably have a thickness of 0.1 $\mu$m to 1 $\mu$m, particularly with the lower and upper limits being 0.2 $\mu$m and 0.5 $\mu$m, respectively.

The active layer should preferably have a carrier concentration of up to $1\times10^{18}$ cm$^{-3}$, particularly with the lower and upper limits being $1\times10^{17}$ cm$^{-3}$ and $5\times10^{17}$ cm$^{-3}$, respectively.

Stacked on the active layer is the third clad layer 106 comprising a second conductive type of AlGaInP compound and having a thickness of up to 0.5 μm. The third clad layer should preferably have a carrier concentration lying in the range of $5\times10^{16}$ cm$^{-3}$ to $3\times10^{18}$ cm$^{-3}$, particularly with the lower and upper limits of $1\times10^{17}$ cm$^{-3}$ and $1\times10^{18}$ cm$^{-3}$, respectively.

Stacked on the third clad layer is the fourth clad layer 107 comprising a second conductive type of AlGaAsP compounds.

When the fourth clad layer 107 comprising a second conductive type of AlGaAsP compound is stacked on the third clad layer, it should preferably have a thickness lying in the range of 0.5 μm to 3 μm. particularly with the lower and upper limits be 0.8 μm and 1.5 μm, respectively. It should also preferably have a carrier concentration lying in the range of $1\times10^{17}$ cm$^{-3}$ to $1\times10^{19}$ cm$^{-3}$, particularly with the lower and upper limits of $3\times10^{17}$ cm$^{-3}$ and $3\times10^{18}$ cm$^{-3}$, respectively. This fourth clad layer is preferably provided thereon with a light-extracting layer, as will be described later. In this case, the fourth clad layer may have the same composition as the light-extracting layer, and the total thickness of the fourth clad layer plus the light-extracting layer should then preferably be at least 1 μm, particularly 1 to 300 μm, with the range of 1 to 100 μm being most preferred.

In this case, the carrier concentration should preferably lie in the range of $1\times10^{17}$ cm$^{-3}$ to $1\times10^{20}$ cm$^{-3}$, particularly with the lower and upper limits of $5\times10^{17}$ cm$^{-3}$ and $5\times10^{18}$ cm$^{-3}$, respectively. In view of production, it is desired that the fourth clad and light-extracting layers be of the same composition and produced in the form of a single continuous layer.

In the present invention, it is preferable to use the light-extracting layer when the fourth clad layer 107 comprising a second conductive type of AlGaAsP compound is provided on the third clad layer. Preferable for this layer is a compound single crystal layer having an indirect gap band structure, which should preferably have a thickness of 1 μm to 50 μm, particularly with the lower and upper limits of 5 μm and 15 μm, respectively. In this cape, the carrier concentration should preferably lie in the range of $1\times10^{17}$ cm$^{-3}$ to $1\times10^{20}$ cm$^{-3}$, particularly with the lower and upper limits of $5\times10^{17}$ cm$^{-3}$ and $5\times10^{18}$ cm$^{-3}$, respectively. Reference numeral 108 represents a light-reflecting layer.

FIG. 4 illustrates another embodiment of the present invention, i.e., an example of the semiconductor light-emitting device including a light-extracting layer 107' next to a third clad layer, said layer 107' comprising a second conductive type AlGaP or GaP. This device is produced according to Example 2, given later.

In this embodiment, too, all the layers but a fourth clad layer arm prepared as described with reference to FIG. 3. As can be seen from FIG. 4, however, it is the light-extracting layer 107' comprising a second conductive type AlGaP or GaP, not the fourth clad layer 107 comprising an AlGaAsP compound, that is stacked on the third clad layer. This light-extracting layer 107, should preferably have a thickness of at least 1 μm. The thicker, the more preferable, because light absorption on the electrodes is reduced. However, too thick a layer is of no substantial use if an efficiency drop ascribable to the absorption of light by the light-extracting layer per se and electrical resistance is taken into account, Thus, the light-extracting layer should have a thickness of up to 300 μm, more particularly up to 100 μm. It is here to be noted that a light-extracting layer of about 10 μm to about 100 μm in thickness should preferably be formed by hydride vapor phase growth techniques. In this case, the carrier concentration should preferably lie in the range of $1\times10^{17}$ cm$^{-3}$ to $1\times10^{20}$ cm$^{-3}$, particularly with the lower and upper limits of $5\times10^{17}$ cm$^{-3}$ and $5\times10^{18}$ cm$^{-3}$, respectively.

GaP is an indirect gap material having a wide band gap; so it provides a light-extracting layer very effective in a visible range of wavelengths (550 nm to 690 nm) achievable by AlGaInP compounds. Even with $Al_xGa_{1-x}As$ (x=0.6 to 0.8) having a high Al concentration, some transparency is achievable. However, a GaP layer is by far lower in resistivity and wider in surface current spreading area than such an AlGaAs layer. For the light-extracting layer it is also preferable to use an n-type GaP because it is better in transparency and lower in resistivity than a p-type GaP.

In both the embodiments shown in FIGS. 3 and 4, when the p-type layer is an AlGaAs layer, carbon is preferably used as the dopant or doping impurity for the above clad layers, etc., and when the p-type layer is an AlGaInP compound, beryllium and/or magnesium are preferably used as the doping impurities. Furthermore in this case, silicon is preferably used as an n-type doping impurity.

In a more preferable embodiment of the present invention, a light-reflecting layer 108 is interleaved between the substrate and the first clad layer. For the light-reflecting layer various known substances capable of reflecting light may be used. Among these substances, the AlGaAsP compound is preferable in view of composition while a Bragg reflection film is preferable in view of structure.

Other layers, e.g., a cap layer and a contact layer 109 may be prepared in conventional manners.

For LED, it is usually required to grow the light-extracting layer having a relatively large thickness so as to increase external quantum efficiency of light output power. However, growth of this light-extracting layer takes a long time to complete. Accordingly, when the impurity having a high diffusion coefficient, like zinc or selenium, in used as the dopant, the dopant in the clad layers diffuses into the active layer or through the active layer to the opposite layer, so offering some problems such as considerable deterioration of LED characteristics or of reproducibility.

If the thickness of the AlGaInP clad layer is reduced as much as possible as practiced in the present invention, any excessive doping can then be dispensed with for the purpose of prevention or diffusion, because the total amount of the impurities to be diffused can be reduced. This in turn enables the carrier concentration of the n-type clad layer to be reduced to $1\times10^{18}$ cm$^{-3}$ or lower, resulting in improvements in crystal quality and device characteristics. In particular, the present invention is very effective for re-growth of the GaP light-extracting layer having a large thickness by hydride VPE.

When the active layer is provided in the form of a very thin film such as a quantum well structure, it is increasingly required to prevent the above-mentioned diffusion of the impurities. In the present invention, carbon is used as the doping impurity for the p-type AlGaAsP compound clad layer, beryllium or magnesium as the doping impurities for the p-type AlGaInP compound clad layer, and silicon as the doping impurity for the clad layers comprising an n-type AlGaAsP compound and an n-type AlGaInP compound, so that the diffusion of the impurities can be further reduced, so making a great contribution to improvements in device yield and reproducibility.

Moreover, it is effective to use a first conductive type of GaAs substrate which is inclined at an angle of 5 to 25 degrees from the plane (100) in the [011] direction, so that a reduction in the band gap due to the ordering of the atomic alignment inherent in the AlGaInP compound or, in another parlance, a reduction in the light-emitting wavelength can be inhibited, or the surface morphology can be improved or stabilized.

The reduction in the Al composition of the light-emitting layer is important for improving the reliability and lifetime of the device, and this is easily achievable by use of a GaAsP substrate. For lattice matching, it is here advantageous to use an AlGaAsP clad layer or an AlGaAsP light-reflecting layer.

According to the present invention, it is thus possible to achieve reductions in growth time and material cost, and considerable reductions in loads on production equipment by removal of defects, etc., and hence to mass produce a multiplicity of devices at the same time and in a stable manner by using production equipment of large size.

Then, the light-emitting device of the present invention will be explained with reference to FIG. 5 that illustrates one example of the laser diode achieved according to the present invention.

Figure 5:
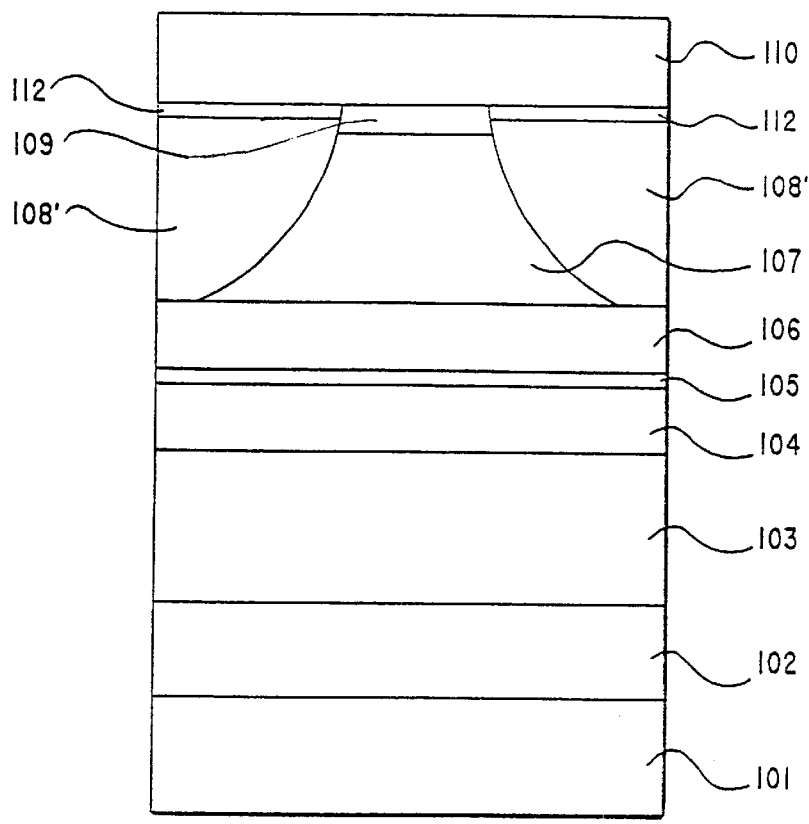
FIG. 5 is a schematic view of a further embodiment of the semiconductor light-emitting device according to the present invention, that is, a laser diode including a fourth clad layer that is located next to the third clad layer and comprises a second conductive type of AlGaAsP compound, and a current block layer for confining an electric current in the active layer.

FIG. 5 illustrates one example of the semiconductor device according to the present invention. This device is produced according to Example 3, given later. For production, the device of the present invention is usually formed on a single crystal substrata. Fox this substrate 101, a GaAs substrate is usually but not exclusively used. It is preferable that a buffer layer 102 of up to about 2 $\mu$m is usually formed on the substrate, thereby preventing transfer of substrate defects into epitaxially grown layers. Then, a first clad layer 103, a second clad layer 104, an active layer 105, a third clad layer 106 and a fourth clad layer 107 are stacked on the buffer layer in the described order according to the present invention. Additionally, a current block layer 108' is provided for the purpose of confining an electric current in the active layer and so increasing the current density across the active layer. The first clad layer 103 comprises a first conductive type of AlGaAsP compound, and it is preferable that its thickness is usually 0.3 $\mu$m to 3 $\mu$m.

More preferably, the lower and upper limits of the thickness of the first clad layer are 0.5 $\mu$m and 1.5 $\mu$m, respectively. The carrier concentration should then preferably lie in the range of $1\times10^{17}$ cm$^{-3}$ to $3\times10^{-18}$ cm$^{-3}$, particularly with the lower and upper limits being $2\times10^{17}$ cm$^-$ and $2\times10^{18}$ cm$^{-3}$, respectively.

Stacked on the first clad layer is the second clad layer 104 comprising a first conductive type of AlGaInP compound and having a thickness of up to 0.5 $\mu$m. More preferably, the lower and upper limits of the thickness of this layer is 0.01 $\mu$m and 0.3 $\mu$m, respectively. The carrier concentration should then preferably lie in the range of $1\times10^{17}$ cm$^{-3}$ to $3\times10^{18}$ cm$^{-3}$, particularly with the lower and upper limits of $2\times10^{17}$ cm$^{-3}$ and $2\times10^{18}$ cm$^{-3}$, respectively.

Stacked on the second clad layer is the active layer 105 comprising a first or second conductive type AlGaInP or GaInP and having a thickness of below 0.1 $\mu$m. The active layer used may have a quantum well structure. No particular limitation is imposed on the carrier concentration of the active layer. In view of stabilized performance of the device, it is rather preferable that the active layer is not doped with any impurity or remains undoped (even in this case, the active layer behaves more or less as the first or second conductive type).

Stacked on such an active layer is the third clad layer 106 comprising a second conductive type of AlGaInP compound and having a thickness of up to 0.5 $\mu$m. The carrier concentration should then preferably lie in the range of $1\times10^{17}$ cm$^{-3}$ to $3\times10^{18}$ cm$^{-3}$, particularly with the lower and upper limits being $2\times10^{17}$ cm$^{-3}$ and $2\times10^{18}$ cm$^{-3}$, respectively.

Stacked on the third clad layer is the fourth clad layer 107 comprising a second conductive type of AlGaAsP compound. The thickness should preferably lie in the range of 0.3 $\mu$m to 3 $\mu$m, particularly with the lower and upper limits being 0.5 $\mu$m and 1.5 $\mu$m, respectively. The carrier concentration should then preferably lie in the range of $1\times10^{17}$ cm$^{-3}$ to $3\times10^{18}$ cm$^{-3}$, particularly with the lower and upper limits being $2\times10^{17}$ cm$^{-3}$ and $2\times10^{18}$ cm$^{-3}$, respectively.

The current block layer 108' used herein is provided, typically for the reason of increasing the current density of the active layer without altering the current to be passed across the device. No particular limitation is imposed on where the current block layer is located. When the current block layer is provided by vapor phase growth techniques such an MOCVD, however, it is preferably located on the side opposite to the substrate, as viewed from the active layer, because a flat active layer or an epitaxially grown layer of high quality can De easily obtainable.

In view of the current confinement effect, it is best to locate the current block layer on the side of the active layer. A problem with this arrangement is, however, that it is likely to do damage to the active layer, It is thus preferable that the current block layer is located just before the third clad layer or overlaps with the third clad layer. It is further preferable that the conductive type of the current block layer is an undoped layer type of high resistance or is opposite to that of the clad layer next thereto. The thickness of the current block layer should preferably be at least 0.1 $\mu$m, particularly at least 0.5 $\mu$m, because at too small a thickness there is a possibility that the current blocking ability may drop. Thus, a choice may be made from the range of about 0.1 $\mu$m to about 3 $\mu$m with device size and other factors in mind. In order to improve the characteristics of the laser device, it is more preferable that the above current block layer comprises AlGaAsP or AlGaAs and has an index of refraction lower than that of the ridged portion that defines a current path.

Referring here to the type of dopant for the above clad layers, when the p-type layer is an AlGaAsP layer, carbon is preferably used as the doping impurity, and when the p-type layer is an AlGaInP compound, beryllium and/or magnesium are preferably used as the doping impurities. Furthermore in this case, silicon is preferably used as an n-type doping impurity.

Other layers, e.g., a cap layer 109, a contact layer 110 and a protecting layer 112, may be prepared in conventional manners.

In semiconductor laser with the active layer being relatively thin (usually up to 0.1 $\mu$m), when the impurity having a high diffusion coefficient, like zinc or selenium, is used as the dopant, the dopant in the clad layers diffuses into the active layer or through the active layer to the opposite layer, so offering some problems such as considerable deterioration of laser characteristics or of reproducibility. The diffusion of Zn may be reduced by increasing the carrier concentration of an n-typo clad layer. However, it has now been found that the device characteristics become worse due to deterioration of crystal quality such as unsatisfactory surface morphology and increases in the number of non-light emitting centers. If the thickness of the AlGaInP clad layer is reduced as much as possible as practiced in the present invention, any excessive doping can then be dispensed with for the purpose of prevention of diffusion, because the total amount of the impurities to be diffused can be reduced. This in turn enables the carrier concentration of the n-type clad layer to be reduced to $1\times10^{18}$ cm$^{-3}$ or lower, resulting in improvements in crystal quality and device characteristics.

When the active layer is provided in the form of a very thin film such as a quantum well structure, it is increasingly required to prevent the above-mentioned diffusion of the impurities. In the present invention, carbon is used as the doping impurity for the p-type AlGaAsP compound clad layer, beryllium or magnesium as the doping impurity for the p-type AlGaInP compound clad layer, and silicon as the doping impurity for the clad layers comprising an n-type AlGaAsP compound and an n-type AlGaInP compound, so that the diffusion of the impurities can be further reduced, so making a great contribution to improvements in device yield and reproducibility.

Since the AlGaAsP compound has some advantages over the AlGaInP compound; the former is lower in resistivity and thermal resistance than the latter, it is preferable to use the AlGaAsP compound to form a ridge portion for achieving the current confinement effect, because the device can be much more reduced in operating voltage and the amount of the heat generated over prior art device structures, so that the characteristics and reliability of the device can be improved.

Moreover, it in affective to use a first conductive type of GaAs substrate which is inclined at an angle of 5 to 25 degrees from the plane (100) in the [011] direction, so that reduction in the bond gap due to the ordering of the atomic alignment inherent in the AlGaInP compound or, in another parlance, a reduction in the light-emitting wavelength can be inhibited, or the surface morphology can be improved or stabilized.

The reduction in the Al concentration or the light-emitting layer is important for improving the reliability and lifetime of the device, and this is easily achievable by use or a GaAsP substrate. For lattice matching, it is here advantageous to use an AlGaAsP clad layer.

According to the present invention, it is thus possible to achieve reductions in growth time and material cost, and considerable reductions in loads on production equipment by removal of defects, etc., and hence to mass produce a multiplicity of devices at the same time and in a stable manner by using production equipment of large size.

The present invention will now be explained more specifically with reference to some examples. However, it is to be noted that the present invention is in no sense limited to the following examples without departing from the purpose of the invention.

Set out below are the examples of the present invention wherein an MOVPE technique known to be excellent in terms of thickness/composition controllability and mass productivity was used for crystal growth. The feed gases used were trimethylaluminum (TMA), trimethylgallium (TMG), trimetlylindium (TMI), phosphine (PH$_3$), and arsine (AsH$_3$), while the carrier gas used was highly purified hydrogen (H$_2$) gas.

EXAMPLE 1

The LED of the present invention, as shown in FIG. 3, was produced in the form of an epitaxial wafer according to the following procedures. Successively grown on an n-type GaAs (100) substrate 101 were an n-type GaAs buffer layer 102 (of 0.5 $\mu$m in thickness), a Bragg reflection film 108 made up of alternately laminated 15 AlGaAs/AlAs laminae, a first clad layer 103 of an n-type Al$_{0.7}$Ga$_{0.3}$As (of 1.0 $\mu$m in thickness), a second clad layer 104 of an n-type (Al$_{0.7}$Ga$_{0.3}$)$_{0.5}$In$_{0.5}$P (of 0.2 $\mu$m in thickness), a (Al$_{0.2}$Ga$_{0.8}$)$_{0.5}$In$_{0.5}$P active layer 105 (of 0.3 $\mu$m in thickness), a third clad layer 106 of a p-type (Al$_{0.7}$Ga$_{0.3}$)$_{0.5}$In$_{0.5}$ (of 0.2 $\mu$m in thikcness), a fourth clad plus light-extracting layer 107 of a p-type Al$_{0.7}$Ga$_{0.3}$As (of 10 $\mu$m in thickness), and a p-type GaAs cap layer 109 (of 2 $\mu$m in thickness).

Referring here to the conditions for crystal growth in this example, the growth temperature was 650° C. to 750° C., the pressure was 10$^2$ hPa, the V/III ratio was 25 to 50 for AlGaAs and 500 to 750 for AlGaInP and GaInP, and the growth rate was 1 to 15 $\mu$m/hr for AlGaAs and 0.5 to 2 $\mu$m/hr for AlGaInP and GaInP.

An LED lamp was prepared from the LED wafer grown by the above-mentioned procedures. It was found that this lamp emits light at 630 nm to 640 nm with a luminance of about 3 cd observed at a driving current of 20 mA. This luminance is nearly twice as high as that obtained with a prior art structure using a p-type AlGaInP clad layer of about 1 $\mu$m thick.

In this example, the n-type substrate was used. However, a p-type substrate may also be used for epitaxial wafer production, if the conductive type of each layer of the structure mentioned above is inverted. For crystal growth, not only is the MOVPE technique used, but also other vapor phase growth techniques such as MBE and CBE may advantageously be used in the present invention.

EXAMPLE 2

The LED of the present invention, as shown in FIG. 4, is produced in the form of an epitaxial wafer according to the following procedures. Successively grown on a p-type GaAs (100) substrate 101 are a p-type Gaps buffer layer 102 (of 0.5 $\mu$m in thickness), a Bragg reflection film 108 made up of alternately laminated 15 p-type AlGaAs/AlAs laminae, a first clad layer 103 of a p-type Al$_{0.7}$Ga$_{0.3}$As(of 1.0 $\mu$m in thickness), a second clad layer 104 of a p-type (Al$_{0.7}$Ga$_{0.3}$)$_{0.5}$In$_{0.5}$P (of 0.2 $\mu$m in thickness), a (Al$_{0.4}$Ga$_{0.6}$)$_{0.5}$In$_{0.5}$P active layer 105 (of 0.3 $\mu$m in thickness), a third clad layer 106 of an n-typo (Al$_{0.7}$Ga$_{0.3}$)$_{0.5}$In$_{0.5}$P (of 0.2 $\mu$m in thickness), and an n-type Gap light-extracting layer 107' (of 4 $\mu$m in thickness).

Referring here to the conditions for crystal growth in this example, the growth temperature is 650° C. to 800° C., the pressure ia 10$^2$ hPa, the V/III ratio is 25 to 50 for GaAs and AlGaAs. 500 to 750 for AlGaInP abd GaInP and 50 to 200 for GaP, and the growth rate is 1 to 5 $\mu$m/hr for GaAs and AlGaAs, 0.5 to 2 $\mu$m/hr for AlGaInP and GaInP and 0.5 to 5 for GaP.

An LED lamp is prepared from the LED wafer grown by the above-mentioned procedures. It is found that this lamp emits light at 580 nm to 590 nm with a luminance of about 1.5 cd observed at a driving current of 20 mA. This luminance is nearly twice as high as that obtained with a prior art structure using a p-type AlGaInP clad layer of about 1 $\mu$m thick.

EXAMPLE 3

Figure 6:
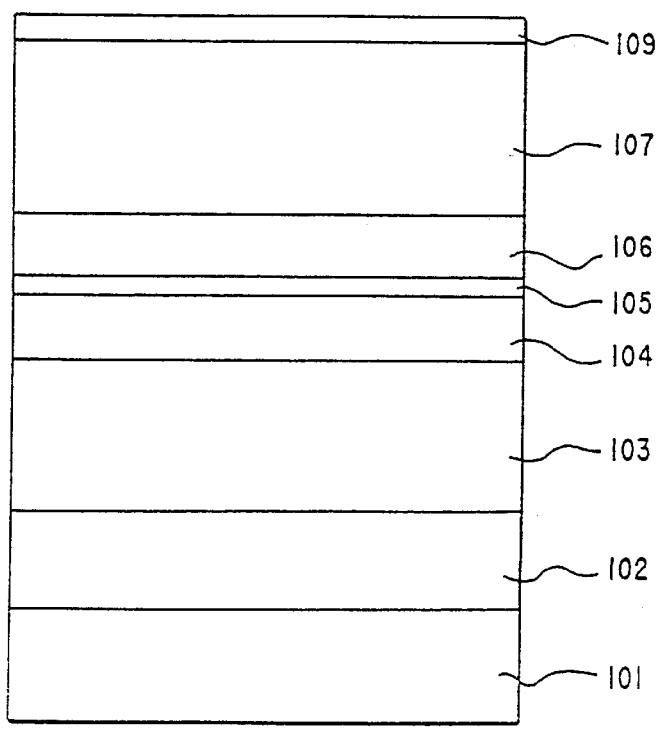
FIG. 6 is a schematic view for providing an illustration of how to produce the laser diode according to the present invention.

An epitaxial wafer used for the production of the laser diode of the present invention, as shown in FIG. 5, was prepared according to the following procedures. Successively grown on an n-type GaAs (100) substrate 101 were an n-type GaAs buffer layer 102 (of 0.5 $\mu$m in thickness), a first clad layer 103 of an n-type Al$_{0.7}$Ga$_{0.3}$As (of 1.0 $\mu$m in thickness), a second clad layer 104 of an n-type (Al$_{0.7}$Ga$_{0.3}$)$_{0.5}$In$_{0.5}$P (of 0.2 $\mu$m in thickness), a Ga$_{0.3}$In$_{0.5}$P active layer 105 (of 0.06 μm in thickness), a third clad layer 106 of a p-type $(Al_{0.7}Ga_{0.3})_{0.5}In_{0.5}P$ (of 0.2 μm in thickness), a p-type $Al_{0.7}Ga_{0.3}As$ clad layer 107 (1.0 μm in thickness), and a p-type GaAs cap layer 109 (0.2 μm in thickness). See FIG. 6.

Figure 7:
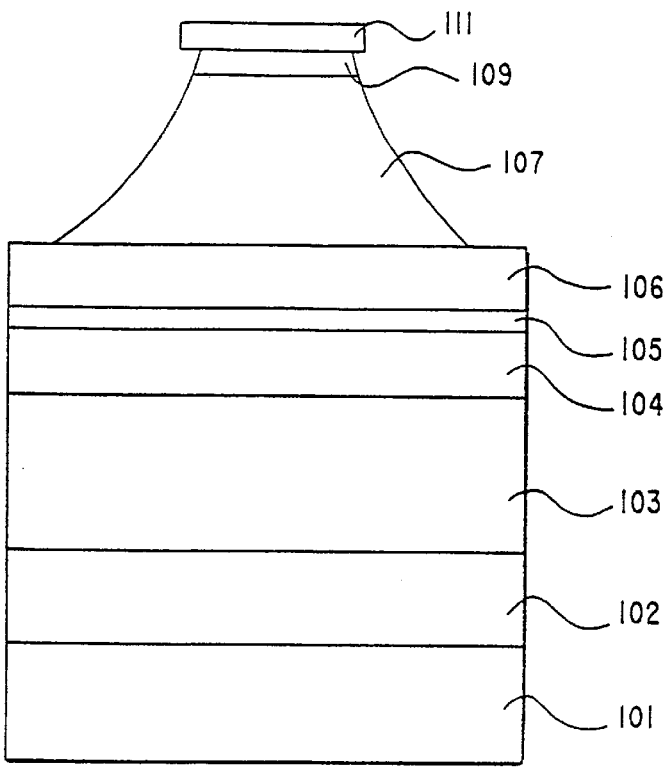
FIG. 7 is a schematic view for providing an illustration of how to produce the laser diode according to the present invention.

Then, an SiNx film 111 was formed on a portion which was to be ridged. Subsequently, the fourth clad layer 107 and cap layer 109 were etched, and etching was stopped on the surface of the third clad layer 106. Consequently, such a ridge as shown in FIG. 7 wag formed.

For the etching of the GaAs cap and AlGaAs clad layers, phosphoric acid-hydrogen peroxide, tartaric acid-hydrogen peroxide, and other etchant systems may De used. By such etching, it is possible to determine the thickness of the outer portion of the ridge in a well controlled manner, because the etching rate of AlGaInP is by far slower than that of AlGaAs.

Figure 8:
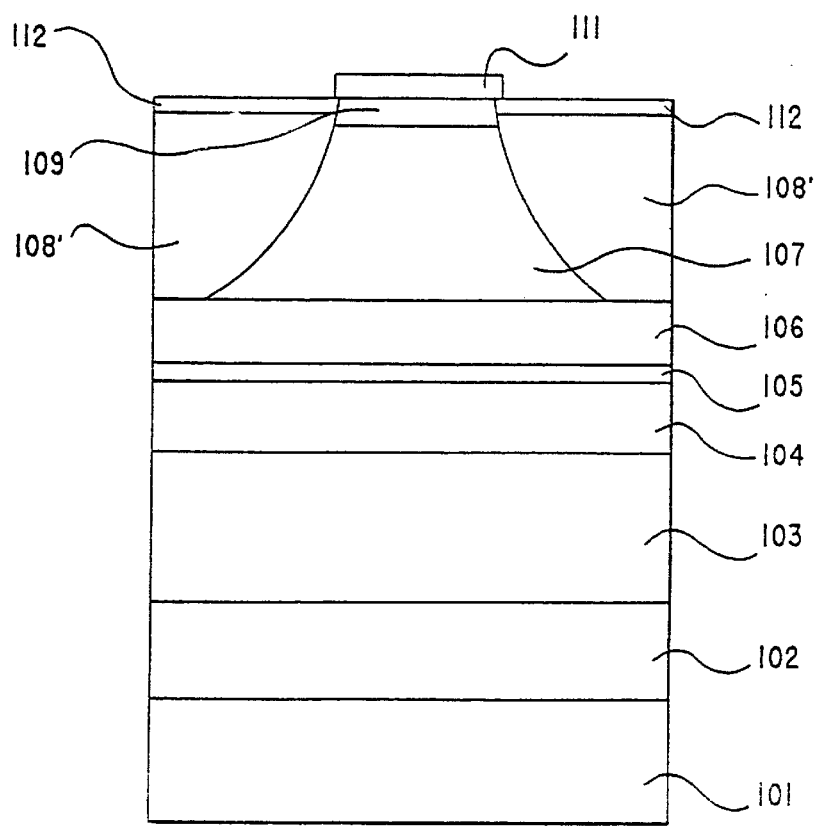
FIG. 8 is a schematic view for providing an illustration of how to produce the laser diode according to the present invention.

While the thus ridged water was placed on MOCVD equipment, an n-type $Al_{0.8}Ga_{0.2}As$ layer 108' in the form of a current block layer was grown on the sides of the ridged portion including the cap layer 109 and the etched layer 107 at a thickness of 0.8 μm, using the MOCVD technique as shown in FIG. 8.

An n-type GaAs layer 112 in the form of a protecting layer was grown on the current block layer 108' at a thickness of 0.2 μm. During this growth process, a trace amount of HCl gas was introduced into the growth space, thereby inhibiting the accumulation of polycrystals on the $SiN_x$ film of the $Al_{0.8}Ga_{0.2}As$ layer.

After removal of the $SiN_x$ film 111 as shown in FIG. 5, a p-type GaAs contact layer 110 was grown at a thickness of 2 μm to bring the production of the epitaxial wafer of the present invention to an end.

The obtained epitaxial wafer was provided with electrodes by evaporation, and then diced to produce a laser diode having a Fabry-Perot plane formed on it through cleavage. The threshold current was as low as 20 mA, with the uniformity in the plane being very excellent, as expressed in terms of about ±5% in the case of a 2-inch wafer. Moreover, device resistance could be nearly reduced by half by using AlGaAs for the ridge in place of AlGaInP used so far in the art.

Referring here to the conditions for crystal growth in this example, the growth temperature was 650° C. to 750° C., the pressure was $10^2$ hPa, the V/III ratio was 25 to 50 for AlGaAs and 500 to 750 for AlGaInP and GaInP, and the growth rate was 1 to 5 μm/hr for AlGaAs and 0.5 to 2 μm/hr for AlGaInP and GaInP.

In this examples the n-type substrate was used. However, a p-type substrate may also be used for epitaxial water production, it the conductive type of each layer of the structure mentioned above is inverted. For crystal growth, not only can the MOVPE technique be used, but also other vapor phase growth techniques such as MBE and CBE may advantageously be used in the present invention.

According to the present invention, the characteristics and reliability of the light-emitting device can be improved with a reduction in the material cost by the structural optimization of the clad layers between which the active layer comprising AlGaInP or GaInP is interposed.

What we claim is:

1. A semiconductor laser diode including a first clad layer comprising a first conductive type AlGaAsP or AlGaAs, a second clad layer that comprises a first conductive type AlGaInP or AlInP and has a thickness of up to 0.5 μm, an active layer that comprises AlGaInP or GaInP, a third clad layer that comprises a second conductive type AlGaInP or AlInP and has a thickness of up to 0.5 μm, and said layers being stacked in the above described order, and said laser diode includes a fourth clad layer that comprises a second conductive type AlGaAsP or AlGaAs and a current block layer for confining an electric current in said active layer, said current block layer comprising AlGaAsP or AlGaAs, and having an index of refraction lower than that of a structure portion defining a current path.

2. The semiconductor laser diode as recited in claim 1, wherein said first clad layer and/or said fourth clad layer have a ridge structure comprising AlGaAsP or AlGaAs, and the current block layer is located on both sides of said ridge structure.

3. The semiconductor laser diode as recited in claim 1, wherein said current block layer is opposite in the conductive type to the clad layer located next thereto, or is a high-resistance semiconductor.

4. The semiconductor laser diode as recited in claim 1, wherein the structure portion is a ridge structure, said current block layer is contiguous to the side wall of the ridge structure comprising AlGaAs and the bottom of the ridge structure comprising AlGaInP or AlInP.

5. The semiconductor laser diode as recited in claim 1, wherein n-type layers of said clad layers have a carrier concentration of up to $1\times10^{18}$ $cm^{-3}$.

6. The semiconductor laser diode as recited in claim 1, wherein of the first and fourth clad layers, the p-type layer comprises AlGaAsP or AlGaAs, and contains carbon as a doping impurity.

7. The semiconductor laser diode as recited in claim 1, wherein of the second and third clad layers, the p-type layer comprises AlGaInP or AlInP, and contains beryllium and/or magnesium as a doping impurity.

8. The semiconductor laser diode as recited in any one of claims 1–4 and 5–7, wherein silicon is used as an n-type doping impurity.

* * * * *